(12) United States Patent
Kim

(10) Patent No.: US 8,342,708 B2
(45) Date of Patent: Jan. 1, 2013

(54) LIGHT EMITTING DEVICE, LIGHT EMITTING SYSTEM COMPRISING THE SAME, AND METHOD OF FABRICATING THEREOF

(75) Inventor: Hyun Kim, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 298 days.

(21) Appl. No.: 12/661,638

(22) Filed: Mar. 22, 2010

(65) Prior Publication Data

US 2010/0237780 A1    Sep. 23, 2010

(30) Foreign Application Priority Data

Mar. 23, 2009 (KR) .................. 10-2009-0024484

(51) Int. Cl.
*F21V 9/00* (2006.01)

(52) U.S. Cl. .................. 362/231; 362/227; 362/545

(58) Field of Classification Search .......... 257/79, 257/88, 99; 315/291, 39.55, 311, 82; 362/231, 362/227, 545
See application file for complete search history.

(56) References Cited

U.S. PATENT DOCUMENTS

| 7,532,173 | B2 * | 5/2009 | Yamazaki et al. | 345/1.1 |
| 2002/0070681 | A1 * | 6/2002 | Shimizu et al. | 315/246 |
| 2006/0081869 | A1 | 4/2006 | Lu et al. | |
| 2010/0259758 | A1 * | 10/2010 | Asano | 356/479 |
| 2010/0321418 | A1 * | 12/2010 | Hayashi | 345/690 |

FOREIGN PATENT DOCUMENTS

| JP | 5-335625 A | 12/1993 |
| KR | 10-2005-0000690 A | 1/2005 |

* cited by examiner

*Primary Examiner* — Jacob Y Choi
*Assistant Examiner* — Henry Luong
(74) *Attorney, Agent, or Firm* — Onello & Mello LLP

(57) ABSTRACT

A light emitting device that provides white light of various color temperatures by using a double-sided light emitting element, a light emitting system comprising the same, and a method of fabricating thereof are provided. The light emitting device includes a double-sided light emitting element including a first light emitting element on one side of a substrate and emits light having a first wavelength and a second light emitting element on the other side of the substrate and emits light having a second wavelength, wherein the first wavelength and the second wavelength are different each other, a first variable resistor coupled to the first light emitting element and adjusting a first driving power applied to the first light emitting element, and a second variable resistor coupled to the second light emitting element and adjusting a second driving power applied to the second light emitting element.

14 Claims, 13 Drawing Sheets

LIGHT EMITTING DEVICE, LIGHT EMITTING SYSTEM COMPRISING THE SAME, AND METHOD OF FABRICATING THEREOF

CROSS REFERENCE TO RELATED APPLICATIONS

This application claims from the benefit of Korean Patent Application No. 10-2009-0024484 filed on Mar. 23, 2009 in the Korean Intellectual Property Office, the contents of which is incorporated herein by reference in their entirety.

BACKGROUND

1. Field

Exemplary embodiments relate to a light emitting device, a light emitting system comprising the same, and a method of fabricating thereof. More particularly, the exemplary embodiments relate to a light emitting device that provides white light of various color temperatures by using a double-sided light emitting element, a light emitting system comprising the same, and a method of fabricating thereof.

2. Description of Related Art

A light emitting element such as LED (Light Emitting Diode) emits light by a combination of electrons and holes. A light emitting element can require little power consumption, and enjoy a long life span. Further, it can be installed in a limited space. Further, a light emitting element has strong characteristics against vibration.

Depending on the fabrication methods, a light emitting device can generate light of various wavelengths, for example, blue light, UV light, and white light wavelengths.

To generate white light, yellow phosphor can spread over a light emitting element that emits light with a wavelength such as blue light to generate bluish white light. Also, yellow phosphor and red phosphor can spread over a blue light emitting element and a light emitting device that generates reddish white light can thus be provided. However, such cases can have limitations of providing various color temperatures.

SUMMARY

The present inventive concepts provide a light emitting device that can provide white light with various color temperatures by using a double-sided light emitting element.

The present inventive concepts also provide a light emitting system that includes the light emitting device.

The present inventive concepts also provide a method of fabricating a light emitting device that can provide white light with various color temperatures by using a double-sided light emitting element.

The present inventive concepts also provide a method of fabricating light emitting system that includes the method of fabricating the light emitting device.

Additional advantages, objects, and features of the inventive concepts will be set forth in part in the description which follows and in part will become apparent to those having ordinary skill in the art upon examination of the following or may be learned from practice of the inventive concepts.

In one aspect of the present inventive concepts, there is provided a light emitting device, which comprises a double-sided light emitting element including a first light emitting element on one side of a substrate and that emits light having a first wavelength and a second light emitting element on another side of the substrate and that emits light having a second wavelength, wherein the first wavelength and the second wavelength are different each other; a first variable resistor coupled to the first light emitting element, the first variable resistor adjusting a first driving power applied to the first light emitting element; and a second variable resistor coupled to the second light emitting element, the second variable resistor adjusting a second driving power applied to the second light emitting element.

In an embodiment, the light emitting device further comprises a support substrate and first and second power supply patterns positioned on the support substrate, the first and second power supply patterns applying power to the first and the second light emitting elements, respectively.

In an embodiment, the first light emitting element is wire bonded to the first power supply pattern and the second light emitting element is a flip chip bonded to the second power supply pattern.

In an embodiment, the first and the second variable resistors are connected to the first and second power supply patterns, respectively.

In an embodiment, the first and the second variable resistors are connected to the first and second power supply pattern directly or through a wire.

In an embodiment, at least one of the first and the second variable resistors includes a resistor pattern, multiple conductive patterns formed on the resistor pattern, and a resistance control wire that connects more than two conductive patterns selected from the multiple conductive patterns.

In an embodiment, resistance values of the first and the second variable resistors are controlled by a number of the multiple conductive patterns that conduct current through the resistance control wire.

In an embodiment, the first and the second variable resistors include a resistor pattern and a resistance control groove that controls an area of the resistor pattern.

In an embodiment, resistance values of the first and second variable resistors are controlled by the area of the resistor pattern.

In an embodiment, the light emitting device further comprises first and a second lead electrodes on which the support substrate and the first and the second light emitting elements are mounted and a housing into which the first and the second lead electrodes are inserted, the housing surrounding the first and the second light emitting elements.

In an embodiment, the first and the second variable resistors are connected to the first and the second lead electrodes, respectively.

In an embodiment, the first and the second variable resistors are connected to the first and the second lead electrodes, respectively, directly or through a wire.

In an embodiment, the light emitting device further comprises a phosphorescence layer including a phosphor which transforms light having the first and second wavelengths generated from the first and second light emitting elements into light having a third wavelength, wherein the first through the third wavelengths generate white light.

In an embodiment, the first and the second variable resistors are controlled to adjust a color temperature of the white light.

In an embodiment, one of the first and second light emitting elements has a maximum light emitting efficiency and the other of the first and second light emitting elements does not have the maximum light emitting efficiency by controlling resistance values of the first and the second variable resistors to adjust a color temperature.

In an embodiment, the first light emitting element is a blue light emitting element which generates blue light, the second light emitting element is a red light emitting element which generates red light, and the phosphor is a green phosphor that transforms at least a part of the blue light or the red light to generate green light.

In an embodiment, the first and the second variable resistors are controlled to generate a reddish white light and or a bluish white light.

In another aspect of the present inventive concepts, there is provided a light emitting system, which comprises the light emitting device comprising a double-sided light emitting element including a first light emitting element on one side of a substrate that emits light having a first wavelength and a second light emitting element on another side of the substrate that emits light having a second wavelength, wherein the first wavelength and the second wavelength are different each other; a first variable resistor coupled to the first light emitting element, the first variable resistor adjusting a first driving power applied to the first light emitting element; and a second variable resistor coupled to the second light emitting element, the second variable resistor adjusting a second driving power applied to the second light emitting element.

In another aspect of the present inventive concepts, there is provided a method of fabricating a light emitting device, which comprises providing a double-sided light emitting element including a first light emitting element which is formed on one side of a substrate and emits light having a first wavelength and a second light emitting element which is formed on the other side of the substrate and emits light having a second wavelength, wherein the first wavelength and the second wavelength are different each other; connecting a first variable resistor that adjusts a first driving power applied to the first light emitting element to the first light emitting element; and connecting a second variable resistor that adjusts a second driving power applied to the second light emitting element to the second light emitting element.

In an embodiment, providing the double-sided lighting element includes providing the first light emitting element including a first light emitting structure formed on a first substrate, providing the second light emitting element including a second light emitting structure formed on a second substrate, and joining the first and the second light emitting elements to position the first and the second light emitting structures in opposite directions.

In an embodiment, providing the first and the second light emitting elements includes: forming the first and the second light emitting structures on a first and a second mother substrates respectively; scanning a laser into the first and the second mother substrates to form a polycrystalline region extended to a horizontal direction inside the first and the second mother substrates; and forming the first light emitting element including the first light emitting structure formed on the first substrate and the second light emitting element including the second light emitting structure formed on the second substrate by cutting the first and the second mother substrates in the horizontal direction using the polycrystalline region.

In an embodiment, the method further comprises forming a phosphorescence layer including a phosphor which transforms light having first and second wavelengths generated from the first and the second light emitting elements into light having a third wavelength, wherein white light is generated by using the light having the first wavelength and the light having the second and third wavelengths.

In an embodiment, a color temperature of the white light is controlled by adjusting the first and the second variable resistors.

In another aspect of the present inventive concepts, there is provided a method of fabricating a light emitting system including fabricating a light emitting device, comprising: providing a double-sided light emitting element including a first light emitting element which is formed on one side of a substrate and emits light having a first wavelength and a second light emitting element which is formed on the other side of the substrate and emits light having a second wavelength, wherein the first wavelength and the second wavelength are different each other; connecting a first variable resistor that adjusts a first driving power applied to the first light emitting element to the first light emitting element; and connecting a second variable resistor that adjusts a second driving power applied to the second light emitting element to the second light emitting element.

BRIEF DESCRIPTION OF THE DRAWINGS

The foregoing and other features and advantages of the inventive concepts will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1:
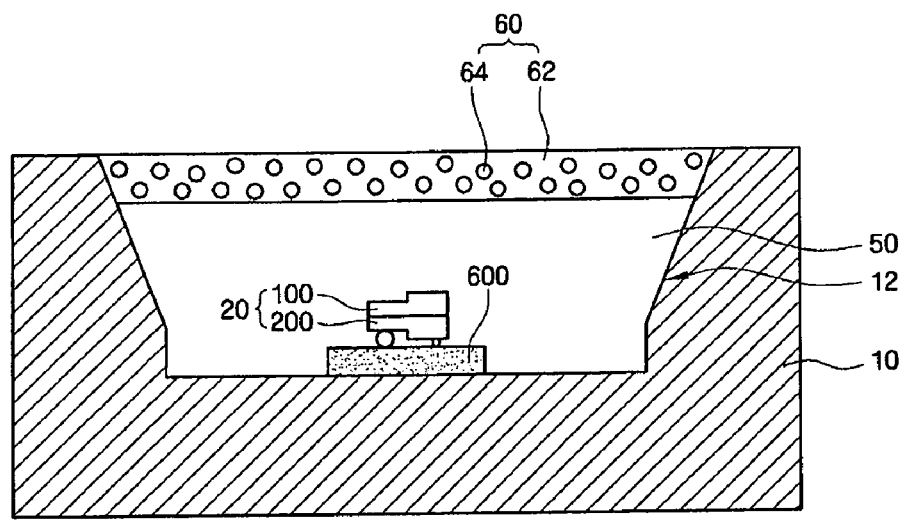
FIG. 1 is a sectional view illustrating a light emitting device according to exemplary embodiments of the present inventive concepts.

Hereinafter, preferred embodiments of the present inventive concepts will be described in detail with reference to the accompanying drawings. The aspects and features of the present inventive concepts and methods for achieving the aspects and features will be apparent by referring to the embodiments to be described in detail with reference to the accompanying drawings. However, the present inventive concepts are not limited to the embodiments disclosed hereinafter, but can be implemented in diverse forms. The matters defined in the description, such as the detailed construction and elements, are nothing but specific details provided to assist those of ordinary skill in the art in a comprehensive understanding of the inventive concepts, and the present inventive concepts are only defined within the scope of the appended claims. In the drawings, sizes and relative sizes of layers and areas may be exaggerated for clarity in explanation.

Although the terms "first, second, and so forth" are used to describe diverse elements, components and/or sections, such elements, components and/or sections are not limited by the terms. The terms are used only to discriminate an element, component, or section from other elements, components, or sections. Accordingly, in the following description, a first element, first component, or first section may be a second element, second component, or second section.

In the following description of the present inventive concept, the terms used are for explaining embodiments of the present inventive concepts, but do not limit the scope of the present inventive concepts. In the description, a singular expression may include a plural expression unless specially described. The term "comprises" and/or "comprising" used in the description means that one or more other components, steps, operation and/or existence or addition of elements are not excluded in addition to the described components, steps, operation and/or elements. Also, the term "A or B" means "A", "B", and "A and B". In the entire description of the present inventive concept, the same drawing reference numerals are used for the same elements across various figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
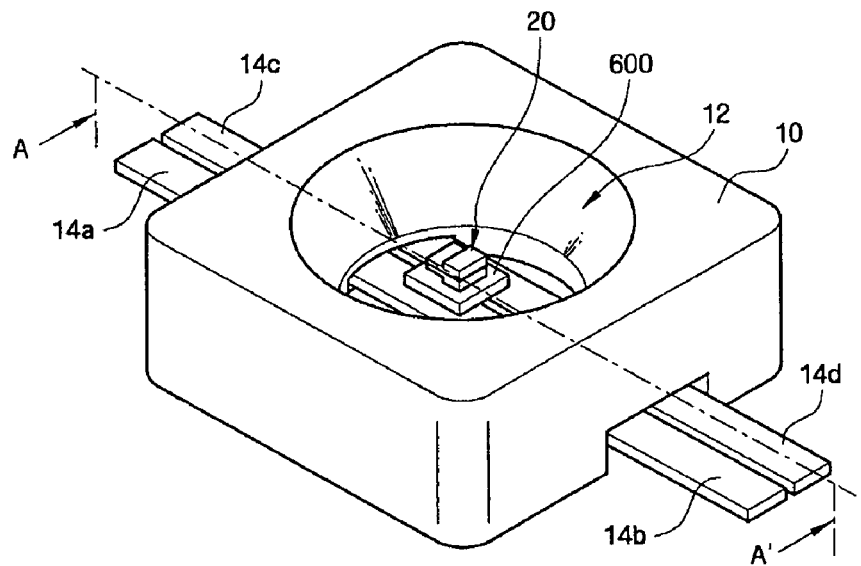
FIG. 2 is a perspective view illustrating a light emitting device according to exemplary embodiments of the present inventive concepts.
Figure 3:
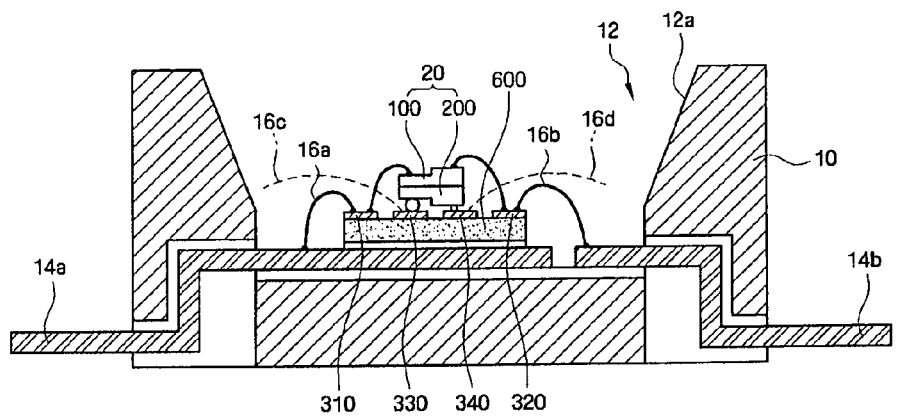
FIG. 3 is a sectional view taken along a line A-A' of FIG. 2.
Figure 4:
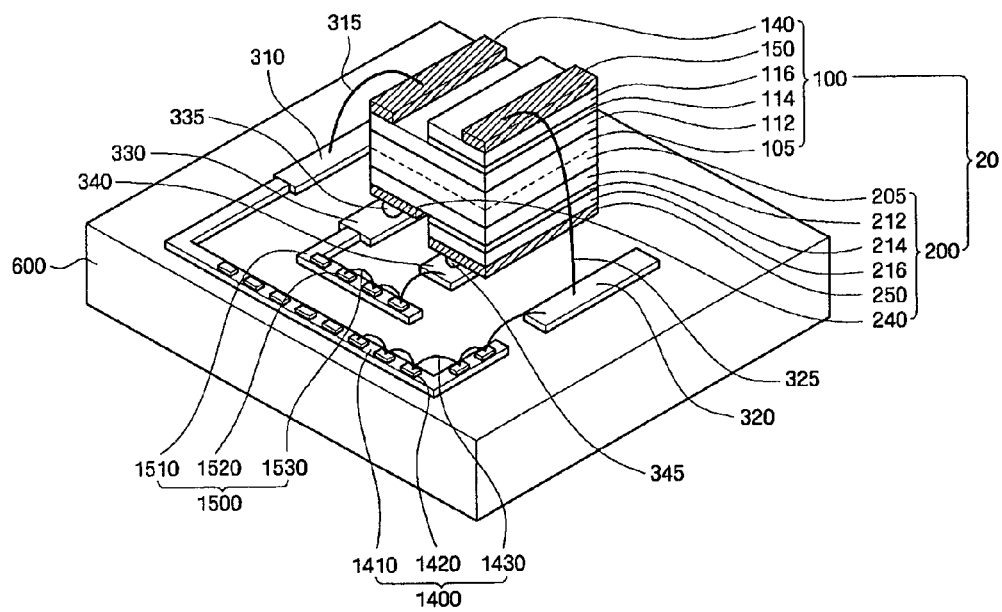
FIG. 4 is a perspective view illustrating a connection between a light emitting element and a variable resistor according to a first exemplary embodiment.

Hereinafter, referring to FIGS. 1 through 4, a light emitting device according to a first exemplary embodiment of the present inventive concept is described in detail. FIG. 1 is a sectional view illustrating a light emitting device according to exemplary embodiments of the present inventive concepts. FIG. 2 is a perspective view illustrating a light emitting device according to exemplary embodiments of the present inventive concept. FIG. 3 is a sectional view taken along a line A-A' of FIG. 2. FIG. 4 is a perspective view illustrating a connection between a light emitting element and a variable resistor according to a first exemplary embodiment.

First, referring to FIG. 1, the light emitting device according to the first exemplary embodiment of the present inventive concept can include a housing 10, a double-sided light emitting element 20, a transparent resin layer 50, a phosphorescence layer 60, and a support substrate 600.

In an embodiment, the housing 10 comprises a slot 12 into the double-sided light emitting element 20 is positioned. In an embodiment, the slot 12 is bigger than the double-sided light emitting device 20 so as to at least partially surround the double-sided light emitting device 20. The size of the slot 12 can be determined by considering reflections of light generated from the double-sided light emitting element 20 on sidewalls 12a of FIG. 3 of the slot 12, reflection angle, and a type of transparent resin layer 50 that fills in the slot 12, a type of the phosphorescence layer 60. Also, the double-sided light emitting element 20 can be placed in the middle of the slot 12. If the distances between the light emitting element 20 and the sidewalls 12a are the same, the ununiformity of chromaticity can be easily prevented.

With regard to the housing 10, in some embodiments, organic materials with superior light resistance including silicon resin, epoxy resin, acrylic resin, urea resin, fluoro resin, and imide resin or inorganic materials with superior light resistance including glass and silica-gel can be used. Also, to prevent resin from melting due to heat during fabrication processes thermo-setting resin can be used. Also, to relieve thermal stress various fillers including aluminum nitride, aluminum oxide, and such compound can be mixed and filled. Also, the housing 10 can be made of other materials than resin. A part of the housing 10 (for example, the side wall) or the entire housing 10 can be made of metal materials or ceramic materials. For example, when metal material is used for the entire housing 10, heat generated from the double-sided light emitting element 20 can be emitted to outside easily.

Referring to FIGS. 2 and 3, the double-sided light emitting element 20 can be composed of a pair of LEDs (Light Emitting Diodes) and mounted on the support substrate 600. The double-sided light emitting element 20 includes a first light emitting element 100 and a second light emitting element 200 where these two light emitting elements are joined to each other in different directions relative to each other, for example, in opposite directions.

Also, although the drawings illustrate that the double-sided light emitting element 20 is connected to the support substrate 600 and that the double-sided light emitting element 20 connected to the support substrate 600 is placed inside the slot 12 of the housing 10, it is not limited thereto. Thus, in embodiments where the support substrate 600 is not provided, the double-sided light emitting element 20 can be installed directly on the housing 10.

The first light emitting element 100 is connected to first power supply patterns 310 and 320 which are placed on the support substrate 600, and the second light emitting element 200 is connected to second power supply patterns 330 and 340 which are placed on the support substrate 600. Although, in some embodiments, the first light emitting element 100 and the first power supply patterns 310 and 320 are placed in a lateral type LED and the second light emitting element 200 and the second power supply patterns 330 and 340 are placed in a flip chip type LED, it is not limited thereto.

Also, although in FIG. 2 the double-sided light emitting element 20 is illustrated as a top view type, it is not limited thereto. For example, the double-sided light emitting element 20 can be a side view type. In case of the top view type, typically a square shape is common and mostly a size bigger than 1 mm×1 mm is used. In embodiments including the top view type, light is radiated directly to a target object, and application devices include lighting devices and display devices. In contrast, in embodiments including the side view type, typically, a rectangular shape is common and generally has dimensions greater than 70 μm×300 μm, for example, 150 μm×400 μm is used. However, depending on the application device the size can change. The application devices include mobile devices, including cellular phones, MP3 players, and Navigations, and the like, and display devices. The top view type and the side view type have difference in size and shape; however, the formation and operations are identical.

The first light emitting element 100 and the second light emitting element 200 can be operated by driving power applied between the electrodes connected to these elements. The driving power is defined by absolute value of the difference between two power values applied between the two electrodes. Here, the driving power can be provided by a DC power source.

The driving power is applied externally by a pair of first lead electrodes 14a and 14b and a pair of second lead electrodes 14c and 14d, which are inserted into the housing 10.

The pair of the first lead electrodes 14a and 14b provides the first light emitting element 100 with power. To accomplish this, the first lead electrodes 14a and 14b and the first power supply patterns 310 and 320 are bonded by wires 16a and 16b. The pair of second lead electrodes 14c and 14d provides the second light emitting element 200 with power. To accomplish this, the second lead electrodes 14c and 14d and second power supply patterns 330 and 340 are bonded by wires 16c and 16d. Although in FIG. 3 the first lead electrodes 14a and 14b and the second lead electrodes 14c and 14d are wire-bonded to the first power supply patterns 310 and 320 and the second power supply patterns 330 and 340 respectively, it is not limited thereto. Specifically, the first lead electrodes 14a and 14b and the second lead electrodes 14c and 14d can be connected to the first power supply patterns 310 and 320 and the second power supply patterns 330 and 340, respectively, through a via formed in the support substrate 600. Also, an interconnection formed along a top, a side, and a bottom of the support substrate 600 can be used to connect the lead electrodes and the power supply patterns.

Referring to FIG. 4, the double-sided light emitting element 20 includes the first light emitting element 100 formed on one side of substrates 105 and 205 that emits light having a first wavelength and the second light emitting element 200 formed on the other side of the substrates 105 and 205 that emits light having a second wavelength. In an embodiment, the first light emitting element 100 and the second light emitting element 200 are joined together at a center of the substrates 105 and 205.

The first light emitting element 100 includes a first conductive layer of the first light emitting element 112 formed with a first conductive type (for example, n-type), a second conductive layer of the first light emitting element 116 formed with a second conductive type (for example, p-type), a light emitting layer of the first light emitting element 114 formed between the first conductive layer of the first light emitting element 112 and the second conductive layer of the first light emitting element 116, a first electrode of the first light emitting element 140 connected to the first conductive layer of the first light emitting element 112, and a second electrode of the first light emitting element 150 connected to the second conductive layer of the first light emitting element 116. When forward driving power is applied to the double-sided light emitting element 20, carriers of the first conductive layer (electrons) are combined with carriers of the second conductive layer (holes) to generate light of the first wavelength. The first conductive layer of the first light emitting element 112, the second conductive layer of the first light emitting element 116, and the light emitting layer of the first light emitting element 114 can be formed with $In_xAl_yGa(1-x-y)N$ ($0 \leq x \leq 1$, $0 \leq y \leq 1$).

The second light emitting element 200 includes a first conductive layer of the second light emitting element 212, a second conductive layer of the second light emitting element 216, a light emitting layer of the second light emitting element 214, which correspond to the first conductive layer of the first light emitting element 112, the second conductive layer of the first light emitting element 116, and the light emitting layer of the first light emitting element 114. Here, the light emitting layer of the second light emitting element 214 generates light having the second wavelength which is different from the first wavelength.

The first electrode of first light emitting element 140 is connected to a first part of the first power supply pattern 310 by a wire 315, and the second electrode of first light emitting element 150 is connected to a second part of the first power supply pattern 320 by a wire 325. The first part of the first power supply pattern 310 and the second part of the first power supply pattern 320 can be composed of conductive materials such as metal.

Also, a first electrode of the second light emitting element 240 is connected to a first part of the second power supply pattern 330 by a first bump 335, and a second electrode of the second light emitting element 250 is connected to a second part of the second power supply pattern 340 by a second bump 345. The first electrode of the second light emitting element 240 and the second electrode of the second light emitting element 250 can be composed of reflective metal such as aluminum (Al) and silver (Ag) to emit light generated from the second light emitting element 200 to top. However, formation of the first electrode of the second light emitting element 240 and the second electrode of the second light emitting element 250 with different conductive materials is not excluded and the first electrode of the second light emitting element 240 and the second electrode of the second light emitting element 250, for example, can be composed of at least one selected from the group consisting of copper (Cu), gold (Au), tungsten (W), platinum (Pt), titanium (Ti), zinc (Zn), and nickel (Ni), or combination or stack thereof.

In this exemplary embodiment, a first variable resistor 1400 is connected between the first power supply patterns 310 and 320, and a second variable resistor 1500 is connected between the second power supply patterns 330 and 340.

The first variable resistor 1400 includes a first resistor pattern 1410, multiple first conductive patterns 1420 formed on the first resistor pattern 1410, and a first resistance control wire 1430 that connects more than two first conductive patterns 1420 selected from the multiple first conductive patterns 1420.

The first resistor pattern 1410 can be composed of metal, semiconductor material, or dielectric material having larger resistance than the first part of the first power supply pattern 310 and the second part of the first power supply pattern 320. One side of the first resistor pattern 1410 can be directly connected to the first part of the first power supply pattern 310. The other side of the first resistor pattern 1410 is connected to the second part of the first power supply pattern 320 through the first resistance control wire 1430; however, they can be connected directly each other.

The first conductive patterns 1420 can be composed of a conductive material, for example, gold or copper. Multiple first conductive patterns 1420 are formed separated from each other, and since only some of the multiple first conductive patterns 1420 are connected to the first resistance control wire 1430 to conduct current, the resistance value of the first variable resistor 1400 can be controlled.

The first resistance control wire 1430 can be composed of conductive materials such as gold and copper, and by allowing current to flow through only some of the first conductive patterns 1420 selected from the first conductive patterns 1420 the resistance of the first variable resistor 1400 can be controlled. As a result, the first variable resistor 1400 can adjust a first driving power applied to the first light emitting element 100 and controls light-emitting efficiency of the first light emitting element 100.

The second variable resistor 1500 includes a second resistor pattern 1510 composed of the same material as the first variable resistor 1400, multiple second conductive patterns 1520 formed on the second resistor pattern 1510, and a second resistance control wire 1530 that connects more than two second conductive patterns 1520 selected from the multiple second conductive patterns 1520. Since the second variable resistor 1500 is connected to the second light emitting element 200, its resistance value can be controlled differently from the resistance value of the first variable resistor 1400. A second driving power can be applied to the second light emitting element 200.

Again, referring to FIG. 1, the transparent resin layer 50 can be positioned over the double-sided light emitting element 20, or can at least partially surround the double-sided light emitting element 20. In an embodiment, the transparent resin layer 50 can fill in at least part of the slot 12.

Any material that can fill in the slot 12 of housing 10 can be used for the transparent resin layer 50. For example, resin including epoxy resin, silicone resin, hard silicone resin, modified silicone resin, urethane resin, oxetane resin, acrylic resin, polycarbonate resin, polyimide resin, or other materials or transparent resins can be used for transparent resin layer 50.

The phosphorescence layer 60 can be formed on the transparent resin layer 50. Specifically, although the phosphorescence layer 60 can be a mixture of transparent resin 62 and phosphor 64, it is not limited thereto. For example, it can only include the phosphor 64 without the transparent resin 62.

Here, the phosphorescence layer 60 is described in detail. The phosphorescence layer 60 absorbs light generated from the double-sided light emitting element 20 and transforms it into light having a different wavelength. Thus, the phosphorescence layer 60 absorbs light having the first wavelength of the first light emitting element 100 and light having the second wavelength of the second light emitting element 200 and transform the light absorbed into light having a third wavelength by light emission. The light having the third wavelength can mean light having one wavelength, and it can also include transformation of each of the light having the first wavelength and the light having the second wavelength into light having one or more different wavelengths.

By using the phosphorescence layer 60, a light emitting device can display various colors. To display white color, the following method can be used. When the first light emitting element 100 emits blue light (light having a blue wavelength) (such the first light emitting element 100 is called blue a light emitting element), the phosphorescence layer 60 can include a green phosphor that transforms part of the blue light and generates green light. Also, when the second light emitting element 200 emits red light (light having a red wavelength) (such the second light emitting element 200 is called a red light emitting element), the phosphorescence layer 60 can transforms part of the red light and generates green light. Also, the phosphorescence layer 60 can include a yellow phosphor that transforms part of blue light or red light and generates green light. Thus, light having the first wavelength generated from the first light emitting element 100, light having the second wavelength generated from the second light emitting element 200, and light having the third wavelength which is transformed by a phosphor and emits is mixed together and white light can be displayed.

In this case, by controlling power delivered to the first light emitting element 100 and the second light emitting element 200, color temperature can be adjusted. Thus, white light can be transformed into from bluish white light to reddish white light. The method to control color temperature of white light by using the double-sided light emitting element 20 is further described in detail.

The phosphorescence layer 60, for example, can be at least one selected from the group consisting of nitride/oxynitride phosphor, alkaline earth halogen apatite phosphor which is mostly activated by lanthanoid series elements including Eu and transition metal series elements including Mn, alkaline earth metal boron halogen phosphor, alkaline earth metal aluminate phosphor, alkaline earth silicate, alkaline earth sulfide, alkaline earth thiogallate, alkaline earth silicon nitride, germinate, rare earth aluminate which is mostly activated by lanthanoid series elements including Ce, rare earth silicate, and organic compound and organic complex which are mostly activated by lanthanoid series elements including Eu; however, it is not limited thereto.

The nitride phosphor which is mostly activated by lanthanoid series elements including Eu and Ce includes $M_2Si_5N_8$:Eu (M is at least one selected from the group consisting of Sr, Ca, Ba, Mg, and Zn). Also, in addition to $M2Si_5N_8$:Eu, $MSi_7N_{10}$:Eu, $M_{1.8}Si_5O_{0.2}N_8$:Eu, $M_{0.9}Si_7O_{0.1}N_{10}$:Eu (M is at least one selected from the group consisting of Sr, Ca, Ba, Mg, and Zn) can be included.

The oxynitride phosphor which is mostly activated by lanthanoid series elements including Eu and Ce includes $MSi_2O_2N_2$:Eu (M is at least one selected from the group consisting of Sr, Ca, Ba, Mg, and Zn).

The alkaline earth halogen apatite phosphor which is mostly activated by lanthanoid series elements including Eu and transition metal series elements including Mn includes $M_5(PO_4)_3$ X:R (M is at least one selected from the group consisting of Sr, Ca, Ba, Mg, and Zn, X is at least one selected from the group consisting of F, Cl, Br, and I, and R is at least one selected from the group consisting of Eu and Mn).

The alkaline earth metal boron halogen phosphor includes $M_2B_5O_9X$:R (M is at least one selected from the group consisting of Sr, Ca, Ba, Mg, and Zn, X is at least one selected from the group consisting of F, Cl, Br, and I, and R is at least one selected from the group consisting of Eu and Mn).

The alkaline earth metal aluminate phosphor includes $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least one selected from the group consisting of Eu and Mn).

The alkaline earth sulfide phosphor includes $La_2O_2S$:Eu, $Y_2O_2S$:Eu, and $Gd_2O_2S$:Eu.

The rare earth aluminate phosphor which is mostly activated by lanthanoid series elements including Ce includes YAG series phosphor such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5O_{12}$. Also, $Tb_3Al_5O_{12}$:Ce, $Lu_3Al_5O_{12}$:Ce. Also, other phosphors include $Tb_3Al_5O_{12}$:Ce and $Lu_3Al_5O_{12}$:Ce where part of Y or entire Y is substituted with Tb or Lu.

The alkaline earth silicate phosphor can include silicate and typical example includes $(SrBa)_2SiO_4$:Eu.

Other phosphor includes ZnS:Eu, $Zn_2GeO_4$:Mn, $MGa_2S_4$:Eu (M is at least one selected from the group consisting of Sr, Ca, Ba, Mg, and Zn, and X is at least one selected from the group consisting of F, Cl, Br, and I).

The previously described phosphors can contain at least one selected from the group consisting of Tb, Cu, Ag, Au, Cr, Nd, Dy, Co, Ni, and Ti to replace Eu or to be added to Eu.

Also, other phosphors that have the identical performance and effect to those of the previously described phosphors can be used.

Figure 5:
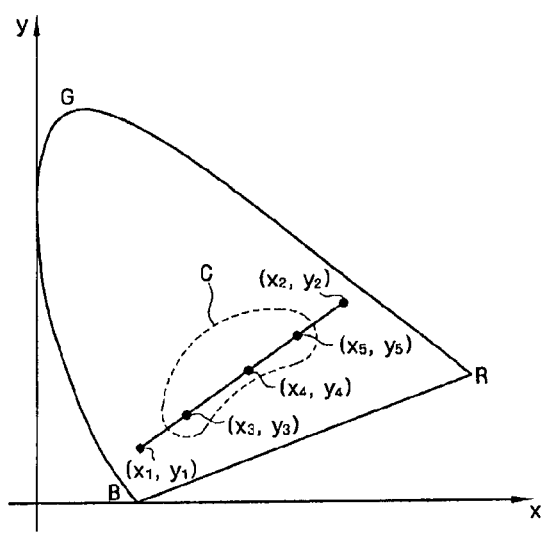
FIG. 5 is a color temperature graph illustrating a color temperature control method of a light emitting device according to the first exemplary embodiment.

Hereinafter, referring to FIG. 5, a color temperature control method of a light emitting device including the double-sided light emitting element 20 of the exemplary embodiments is described. FIG. 5 is a color temperature graph illustrating a color temperature control method of a light emitting device according to exemplary embodiments.

Light generated from the first light emitting element 100 or the second light emitting element 200 close to a first location B in the color coordinate indicates bluish light, close to a second location G in the color coordinate indicates greenish light, and a third location R in color coordinate indicates red light. Also, the circle C illustrated in FIG. 5 represents color temperature range recognized as white light.

For example, the first light emitting element 100 is a blue light emitting element and when power to produce maximum light emission efficiency is applied, it is assumed to be located at first color coordinates (x1, y1).

Also, the second light emitting element 200 is a red light emitting element and when power to produce the maximum light emission efficiency is applied, it is assumed to be located at second color coordinates (x2, y2).

For example, it is assumed that power to produce the maximum light emission efficiency is applied to the first light emitting element 100 by adjusting the first variable resistor 1400 connected to the first light emitting element 100 and power to produce less than the maximum light emission efficiency, for example 80% of the maximum light emission efficiency, is applied to the second light emitting element 200 by adjusting the second variable resistor 1500 connected to the second light emitting element 200. By doing this, light having the first wavelength generated from the first light emitting element 100, light having the second wavelength generated from the second light emitting element 200, and light having the third wavelength which are transformed by the phosphor are mixed and emitted, and white light is generated. In this case, the white light is bluish white light and located at third color coordinates (x3, y3). Since for the first light emitting element 100 the first variable resistor 1400 is adjusted to produce the maximum light emission efficiency and for the second light emitting element 200 the second variable resistor 1500 is adjusted to produce less than the maximum light emission efficiency, blue light which is light of the first wavelength generated from the first light emitting element 100 is dominant.

In another example, by adjusting each of the first variable resistor 1400 and the second variable resistor 1500 to produce the maximum light emission efficiency for both the first light emitting element 100 and the second light emitting element 200, white light with a middle color temperature between blue and red which corresponds to fourth coordinates (x4, y4) can be obtained.

In another example, the first variable resistor 1400 is adjusted to apply power that produces less than the maximum light emission efficiency, for example 80% of the maximum light emission efficiency, to the first light emitting element 100 and the second variable resistor 1500 is adjusted to apply power that produces the maximum light emission efficiency to the second light emitting element 200. In this case, the white light is reddish white light and located at fifth color coordinates (x5, y5). Since for the first light emitting element 100 the first variable resistor 1400 is adjusted to produce less than the maximum light emission efficiency and for the second light emitting element 200 the second variable resistor 1500 is adjusted to produce the maximum light emission efficiency, red light which is light of the second wavelength generated from the second light emitting element 200 is dominant.

As described previously, by adjusting the first variable resistor 1400 and the second variable resistor 1500, a color temperature of the light emitting device can be controlled.

Since both light of the first wavelength and light of the second wavelength are generated from the double-sided light emitting element 20, a color temperature can be more easily controlled compared to a single-sided light emitting element, which generates light of a single wavelength. Thus, since the single-sided light emitting element only generates light of the first wavelength, the single-sided light emitting element may require two phosphors: a phosphor that transforms light into light of the second wavelength and a phosphor that transforms light into light of the third wavelength. In this case, it can be difficult to apply power to the light emitting device that can control both light emission efficiency of the light emitting element and light transformation efficiency of the two phosphors. However, in the double-sided light emitting element 20 of this exemplary embodiment since power applied to the first light emitting element 100 and the second light emitting element 200 is controlled separately by using the first variable resistor 1400 and the second variable resistor 1500, color temperature can be controlled smoothly and accurately.

In this exemplary embodiment, a resistance value of the first variable resistor 1400 can be adjusted by changing the number of the first conductive patterns 1420 that conduct current by cutting part of the first resistance control wire 1430. A resistance value of the second variable resistor 1500 can be adjusted with the identical method that adjusts a resistance value of the first variable resistor 1400.

Figure 6:
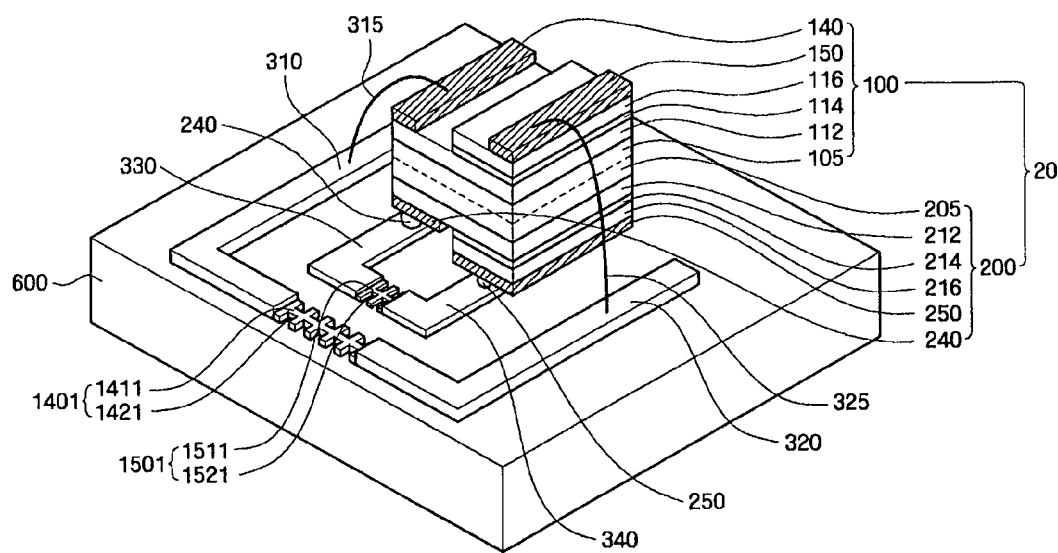
FIG. 6 is a perspective view illustrating a connection between a light emitting element and a variable resistor according to a second exemplary embodiment.

Hereinafter, referring to FIG. 6, a light emitting device according to a second exemplary embodiment of the present inventive concepts is described. FIG. 6 is a perspective view illustrating connection between the light emitting element and a variable resistor according to the second exemplary embodiment. In the following exemplary embodiment, for each component identical to those described above, an identical reference number is assigned, and a description of the identical components is skipped or simplified.

Referring to FIG. 6, a first variable resistor 1401 includes a first resistor pattern 1411 and a first resistance control groove 1421 that controls an area of the first resistor pattern 1411. Resistance value of the first variable resistor 1401 can be adjusted by changing the area of the first resistor pattern 1411 which can be accomplished by changing a number or length of the first resistance control groove 1421.

The first variable resistor 1401 can be directly connected to first power supply patterns 310 and 320. The first variable resistor 1401 can be composed of material having higher resistance value than that of the first power supply patterns 310 and 320. In this exemplary embodiment, the first power supply patterns 310 and 320 can be bent into a shape of "L" to avoid the first variable resistor 1401 with an excessive length.

Similar to the first variable resistor 1401, the second variable resistor 1501 includes a second resistor pattern 1511 and a second resistance control groove 1521 that controls an area of the second resistor pattern 1511. The size of second resistor pattern 1511 can be different from that of the first resistor pattern 1411.

Figure 7:
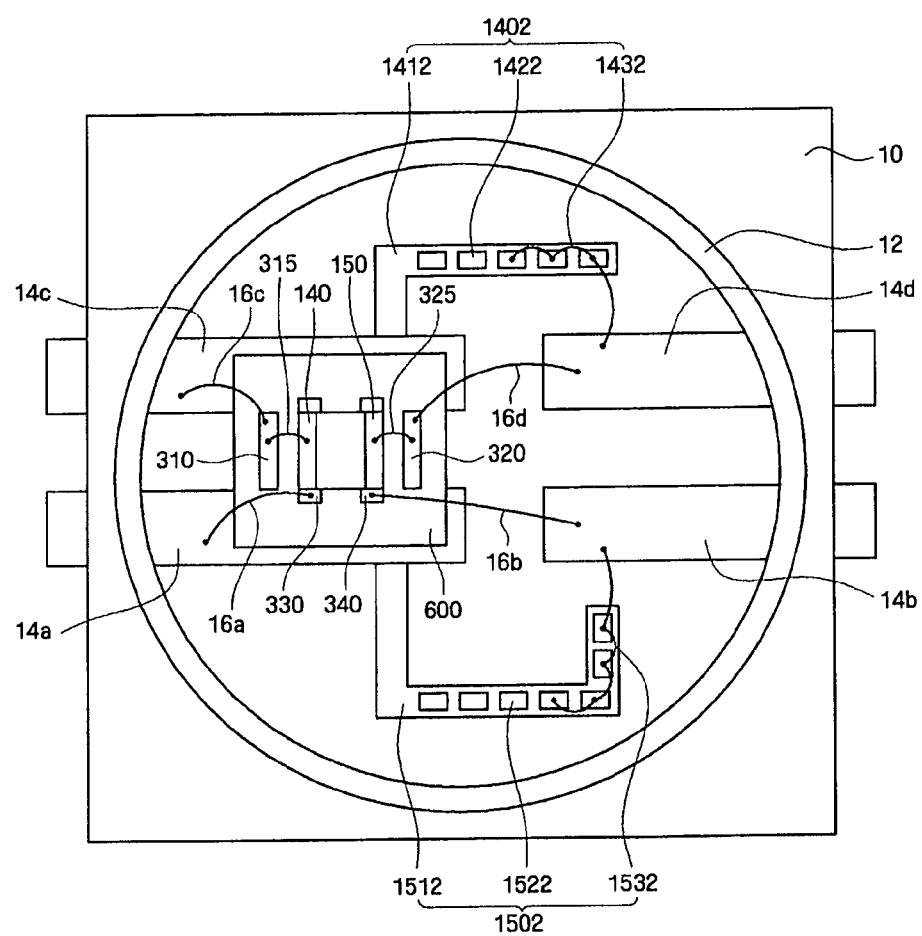
FIG. 7 is a plan view illustrating a connection between a light emitting element and a variable resistor according to a third exemplary embodiment.

Hereinafter, referring to FIG. 7, a light emitting device according to a third exemplary embodiment of the present inventive concepts is described. FIG. 7 is a plan view illustrating connection between the light emitting element and a variable resistor according to the third exemplary embodiment.

Referring to FIG. 7, unlike the previously described exemplary embodiments, a first variable resistor 1402 and a second variable resistor 1502 of this exemplary embodiment are not directly connected to first power supply patterns 310 and 320 and second power supply patterns 330 and 340. In this exemplary embodiment, the first variable resistor 1402 is connected to second lead electrodes 14c and 14d, and the second variable resistor 1502 is connected to first lead electrodes 14a and 14b.

The first variable resistor 1402 includes a first resistor pattern 1412 where one side is connected to a first part 310 of the first power supply patterns 310 and 320 and the other side is connected to a second part of 320 of the first power supply patterns 310 and 320, multiple first conductive patterns 1422 formed on the first resistor pattern 1412, and a first resistance control wire 1432 that controls resistance value by connecting more than two first conductive patterns 1422 selected from the multiple first conductive patterns 1422.

The second variable resistor 1502 includes a second resistor pattern 1512, a multiple second conductive patterns 1522 formed on the second resistor pattern 1512, and a second resistance control wire 1532 that controls resistance value by connecting more than two second conductive patterns 1522 selected from the multiple second conductive patterns 1522 which correspond to the first variable resistor 1402.

The first variable resistor 1402 and the second variable resistor 1502 are formed on a large area outside the support substrate 600. Therefore, the first resistance control wire 1432 and the second resistance control wire 1532 can be easily cut, and controlling resistance value can be simplified.

Figure 8:
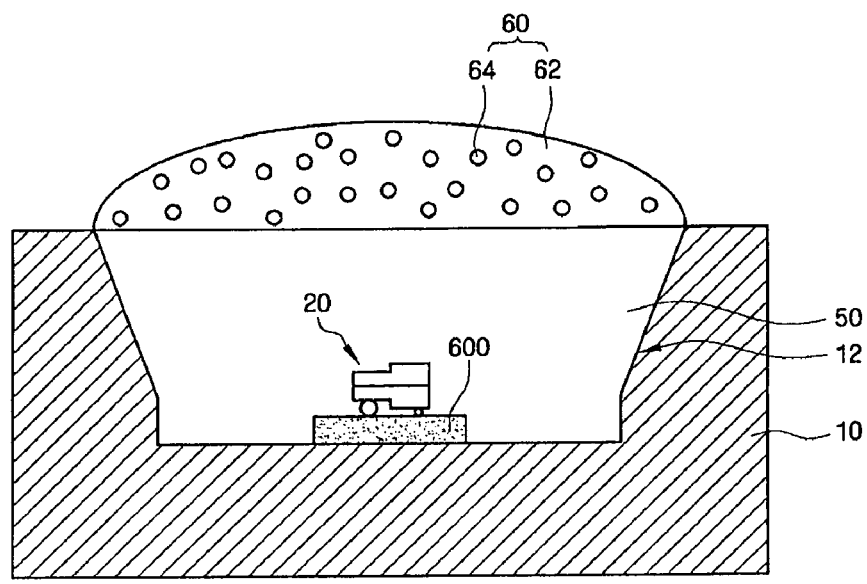
FIG. 8 is a sectional view illustrating a light emitting device according to a fourth exemplary embodiment of the present inventive concepts.

Hereinafter, referring to FIG. 8, a light emitting device according to a fourth exemplary embodiment of the present inventive concept is described. FIG. 8 is a sectional view illustrating a light emitting device according to the fourth exemplary embodiment of the present inventive concepts.

Referring to FIG. 8, a light emitting device according to the fourth exemplary embodiment of the present inventive concept is different from the first through third exemplary embodiments in that a phosphorescence layer 60 is formed in a lens shape. To improve light diffusion/light extraction characteristics of light generated from a double-sided light emitting element 20, the phosphorescence layer 60 can have a constant curvature. In the embodiment illustrated at FIG. 8, the phosphorescence layer 60 is formed in a convex lens shape However, in other embodiments, it can be formed in a concave lens shape.

Figure 9:
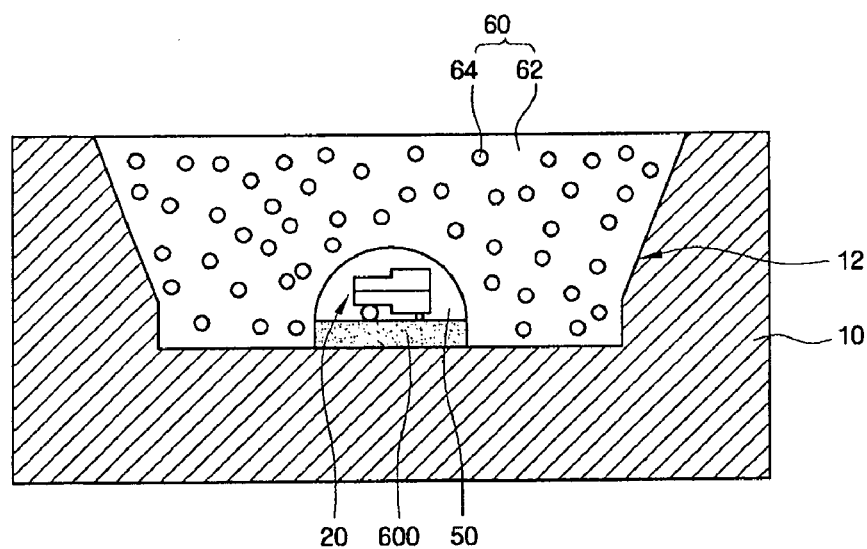
FIG. 9 is a sectional view illustrating a light emitting device according to a fifth exemplary embodiment of the present inventive concepts.

Hereinafter, referring to FIG. 9, a light emitting device according to the fifth exemplary embodiment of the present inventive concept is described. FIG. 9 is a sectional view illustrating a light emitting device according to the fifth exemplary embodiment of the present inventive concepts.

Referring to FIG. 9, the light emitting device according to the fifth exemplary embodiment of the present inventive concepts is different from the first through third exemplary embodiments such that a transparent resin layer 50 is formed only on a double-sided light emitting element 20 and a support substrate 600. Also, on the transparent resin layer 50 a phosphorescence layer 60 is formed to fill in a slot 12.

Hereinafter, a light emitting system by using the previously described light emitting device is described. To aid understanding, the light emitting system by using the light emitting device according to the first exemplary embodiment of the present inventive concept is illustrated; however, it is not limited thereto. It is obvious that those skilled in the art of the present inventive concepts can construct a light emitting system by using the light emitting device according to the second through fifth exemplary embodiments described herein.

FIGS. 10 through 14 are views illustrating a light emitting system according to sixth through tenth embodiments of the present inventive concepts.

Figure 10:
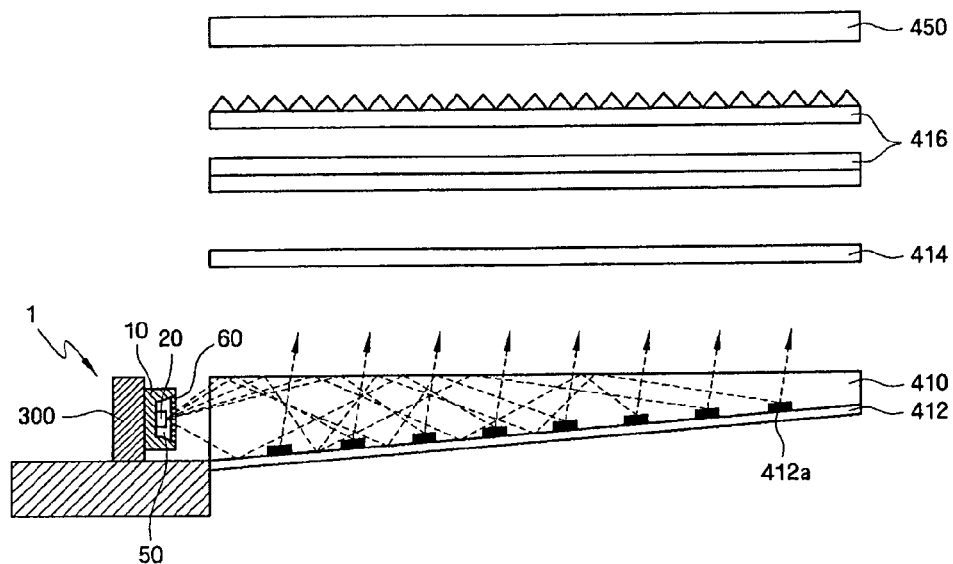
FIGS. 10 through 14 are views illustrating a light emitting system according to sixth through tenth exemplary embodiments of the present inventive concepts.

FIG. 10 illustrates an exemplary system, for example, an end product, which applies a light emitting device according to exemplary embodiment of the present inventive concept. A light emitting system can be used in various devices including lighting devices, display devices, and mobile devices, and the like, for example, cellular phones, MP3 players, and navigation systems. The exemplary device illustrated in FIG. 10 is an edge-type Back Light Unit (BLU) used in a liquid crystal display (LCD) device. Since LCD does not include a self light source, BLU is used as a light source and BLU mainly emits light from a back of a LCD panel.

Referring to FIG. 10, the BLU includes a light emitting device, a light guide panel 410, a reflection panel 412, a diffusion sheet 414, and a pair of prism sheets 416.

The light emitting device provides light. Here, the light emitting device used can be a side view type light emitting device. As described previously, the light emitting device can adjust a level of driving power and control color temperature of white light. Therefore, by controlling color temperature of white light generated from the light emitting device used in the BLU, mood of picture displayed on a liquid crystal panel 450 can be controlled and pictures with feel of user can be created.

The light guide panel 410 guides light supplied to the liquid crystal panel 450. The light guide panel 410 is formed with transparent material such as acrylic resin which is a series of plastic, and it moves light created from the light emitting device toward the liquid crystal panel 450 placed on the light guide panel 410. Thus, on a rear side of the light guide panel 410 various kinds of patterns 412a are printed to change movement direction of light entered into the light guide panel 410 toward the liquid crystal panel 450.

The reflection panel 412 is installed on a bottom side of the light guide panel 410 and reflects light discharged to the bottom of the light guide panel 410. The reflection panel 412 reflects light which is not reflected by the various kinds of patterns 412a toward an output face of the light guide panel 410. As a result, light loss is reduced and uniformity of light that penetrates the output face of the light guide panel 410 is improved.

The diffusion sheet 414 diffuses light that comes out of the light guide panel 410 and prevents light from partial congestion.

On the prism sheet 416 triangular shape prisms are formed in a uniform arrangement. Typically, the prism sheet 416 comprises two sheets, and the prism arrangements are positioned to cross each other at a certain angle, for example, at a predetermined angle, and allow light diffused from the diffusion sheet 414 to move vertically to the liquid crystal panel 450.

FIGS. 11 through 14 are drawings illustrating a light emitting system according to seventh through a tenth embodiments of the present inventive concepts.

Figure 11:
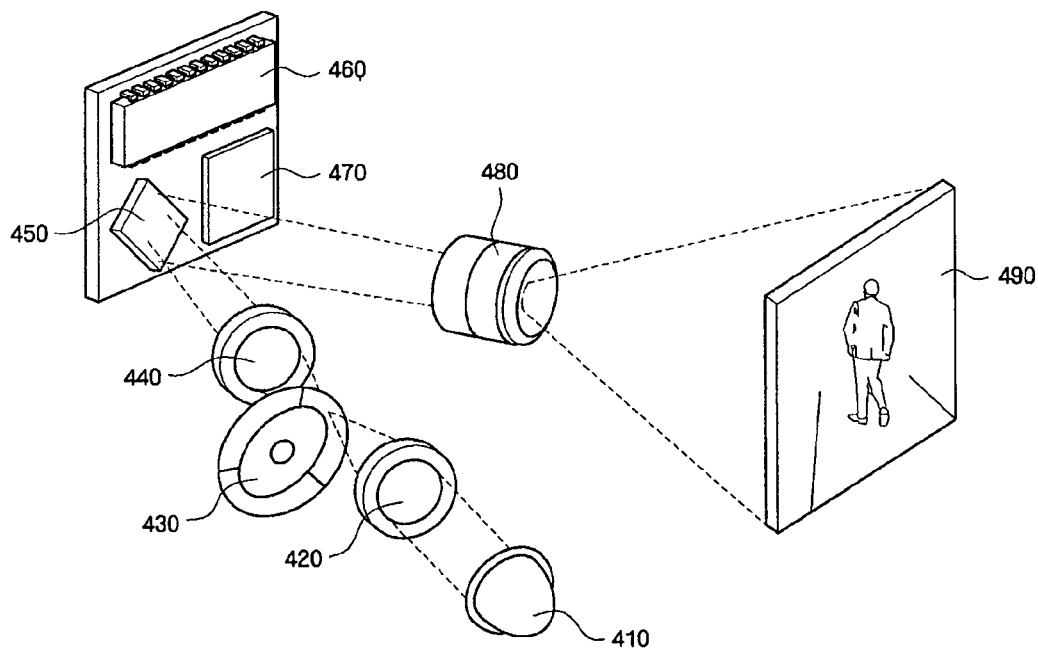
Figure 12:
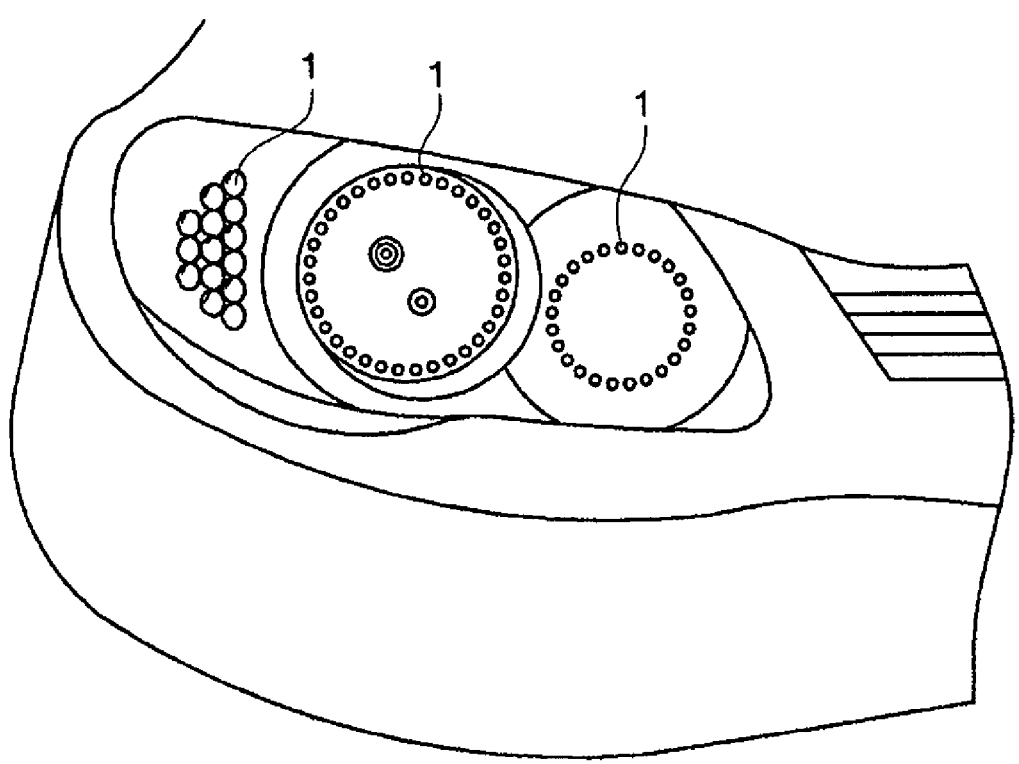
Figure 13:
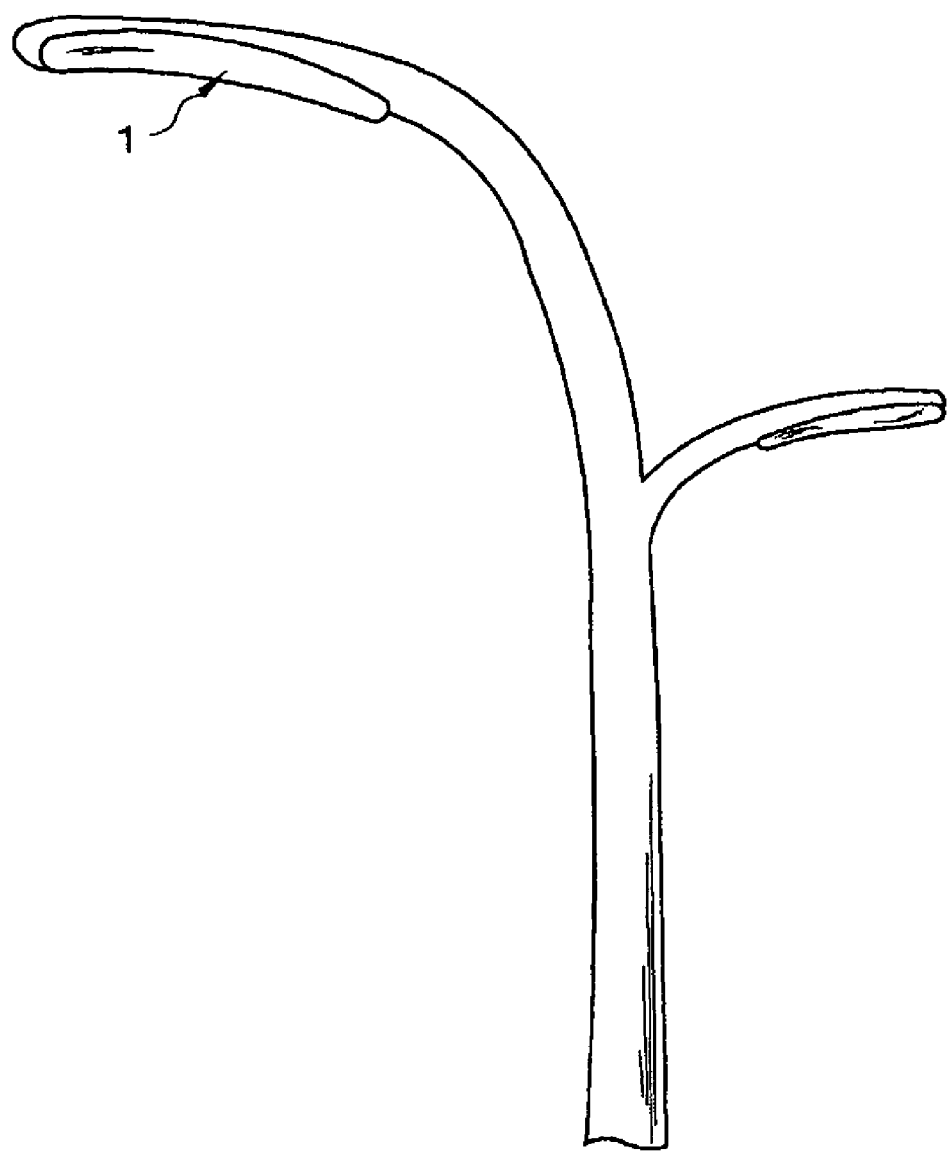
Figure 14:
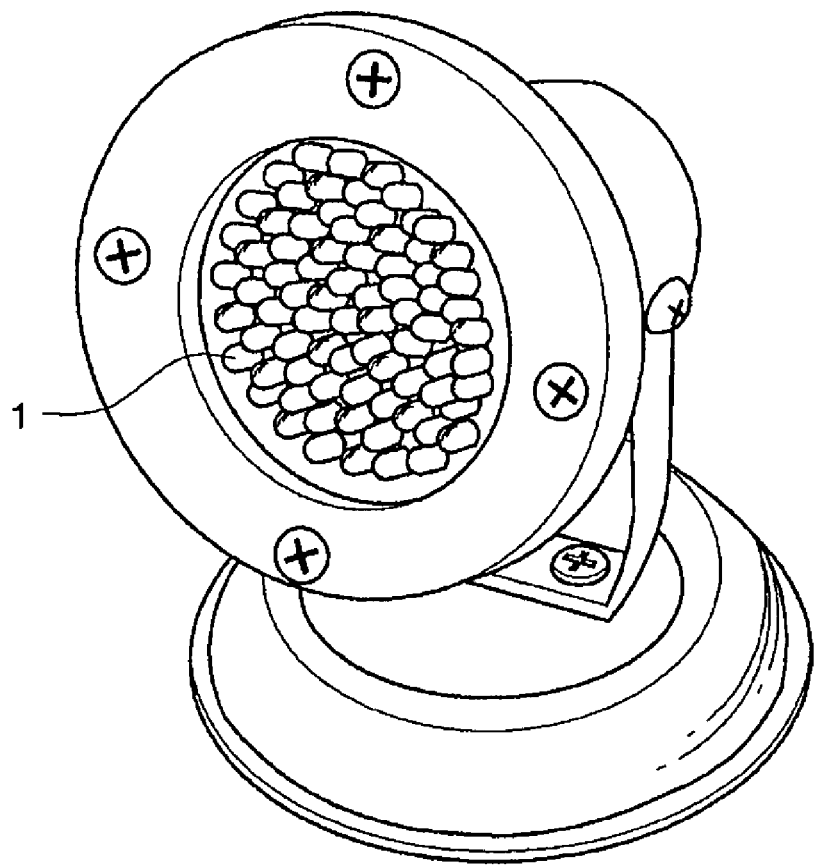

In FIGS. 11 through 14, various applications of a light emitting device 1 similar to those described above are provided. In particular, FIG. 11 illustrates a projector. FIG. 12 illustrates a headlight of cars. FIG. 13 illustrates a streetlight. FIG. 14 illustrates a light lamp. In an embodiment, the light emitting device shown in FIGS. 11 through 14 can be a top view type light emitting device.

Referring to FIG. 11, light from a light source 410 passes a condensing lens 420, a color filter 430, and a sharping lens 440, and is reflected by a DMD (digital micro-mirror device) 450, and passes a projection lens 480, and arrives at a screen 490. Inside the light source 410, the light emitting device according to the present inventive concepts is installed.

For the headlight of cars in FIG. 12, the streetlight in FIG. 12, and the light lamp in FIG. 14, if a color temperature of white light generated by the light emitting device is controlled by changing driving power applied to a double-sided light emitting device by using variable resistor, various moods can be directed.

FIGS. 15 through 21 are views illustrating a method of fabricating a light emitting system according to an eleventh exemplary embodiment of the present inventive concepts.

Figure 15:
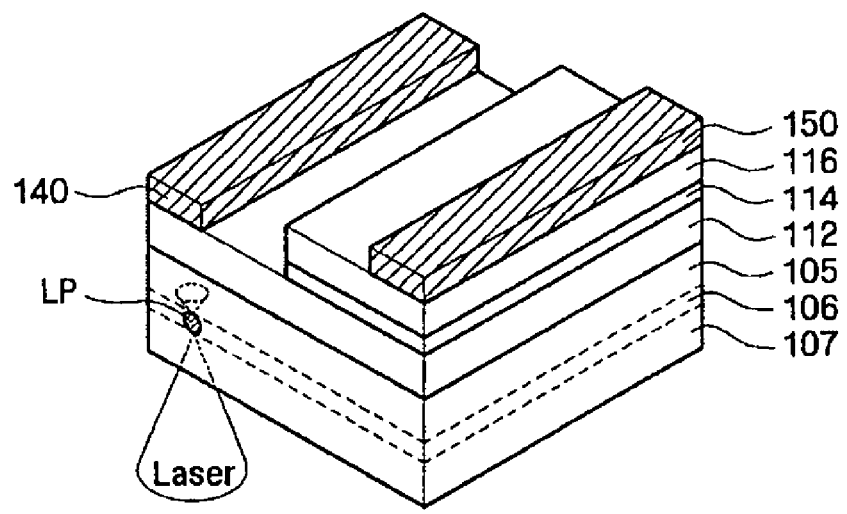
FIGS. 15 through 21 are views illustrating a method of fabricating a light emitting system according to an eleventh exemplary embodiment of the present inventive concepts.

First, referring to FIG. 15, on a first mother substrate 105, 106, and 107, a plurality of first light emitting structures 112, 114, 116, 140, and 150 is formed. In an embodiment, the first mother substrate can comprise one or more layers, for example, layers 105, 106, 107 shown in FIG. 15.

Next, in a predetermined area inside the first mother substrate 105, 106, and 107 a polycrystalline region 106 is formed. Specifically, inside the first mother substrate 105, 106, and 107 a laser point LP (light collecting point/area) is set, and a horizontal permeable nanosecond pulse laser is scanned to form the polycrystalline region 106, which extends in parallel to the horizontal direction inside the first mother substrate 105, 106, and 107. Thus, by performing laser scanning inside the first mother substrate 105, 106, and 107, the polycrystalline region 106 can be formed inside the first mother substrate 105, 106, and 107. By laser, the single-crystalline first mother substrate 105, 106, and 107 is transformed into the polycrystalline first mother substrate 105, 106, and 107. The first mother substrate 105, 106, and 107 is divided into two regions by the polycrystalline region 106.

Here, the horizontal direction can mean an extended direction of the first mother substrate 105, 106, and 107 or a direction practically parallel to the one side/the other side of the first mother substrate 105, 106, and 107.

The LP can be formed inside the first mother substrate 105, 106, and 107. The depth of the LP can vary depending on the width of first substrate 105 after being cut.

Figure 16:
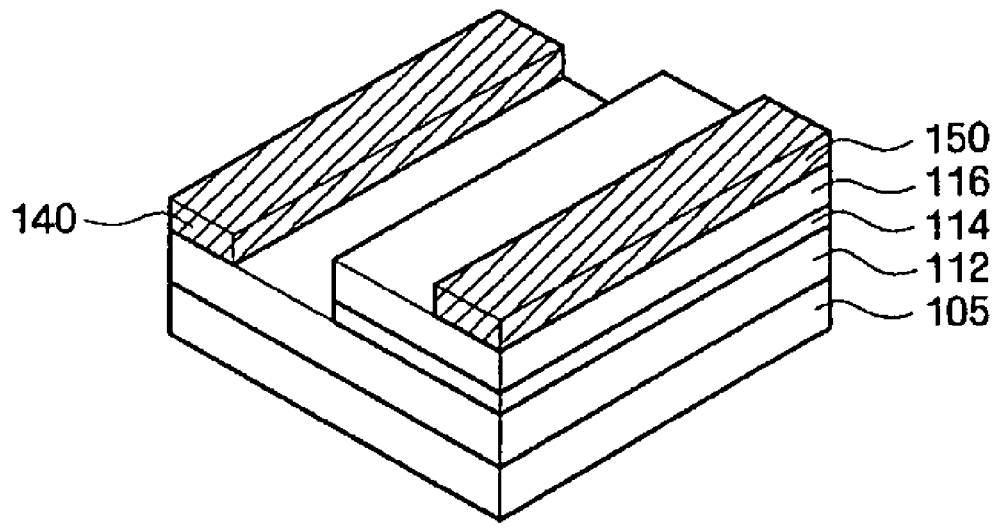

Next, referring to FIG. 16, by using the polycrystalline region 106 the first mother substrate 105, 106, and 107 is cut in the horizontal direction and a first light emitting element 100 is formed.

Specifically, by applying stress (for example, tensile stress) to the first mother substrate 105, 106, and 107 including the polycrystalline region 106 formed inside, the first mother substrate 105, 106, and 107 can be cut around polycrystalline region 106 in the horizontal direction.

Figure 17:
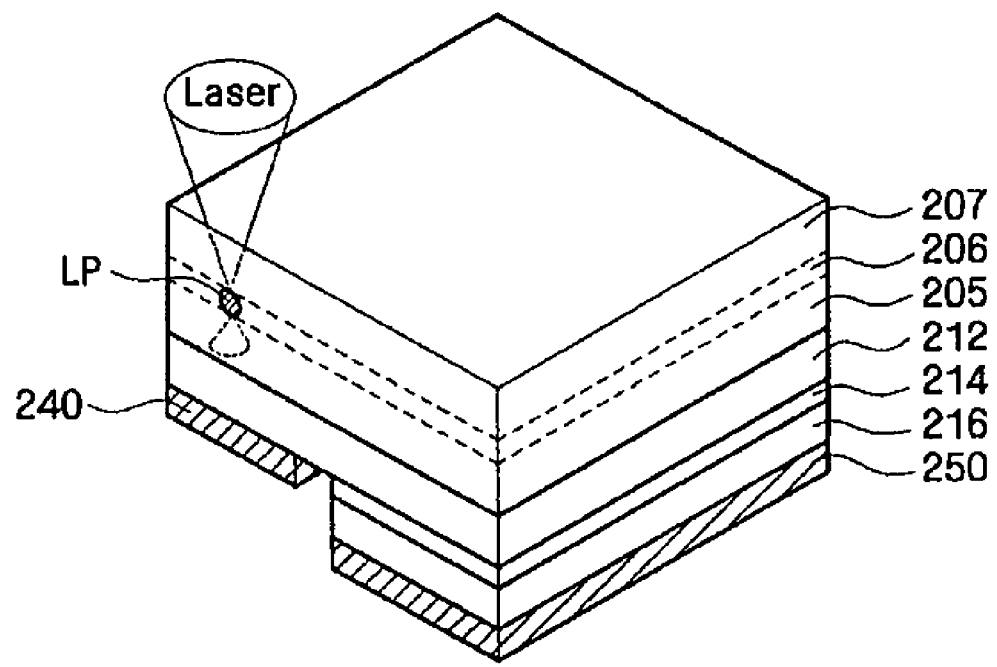

Then, referring to FIG. 17, on a second mother substrate 205, 206, and 207, a second light emitting structure 212, 214, 216, 240, and 250 is formed.

Next, by using the same method described in FIG. 15, laser point LP is set inside the second mother substrate 205, 206, and 207 and a polycrystalline region 206 is formed in the horizontal direction.

Figure 18:
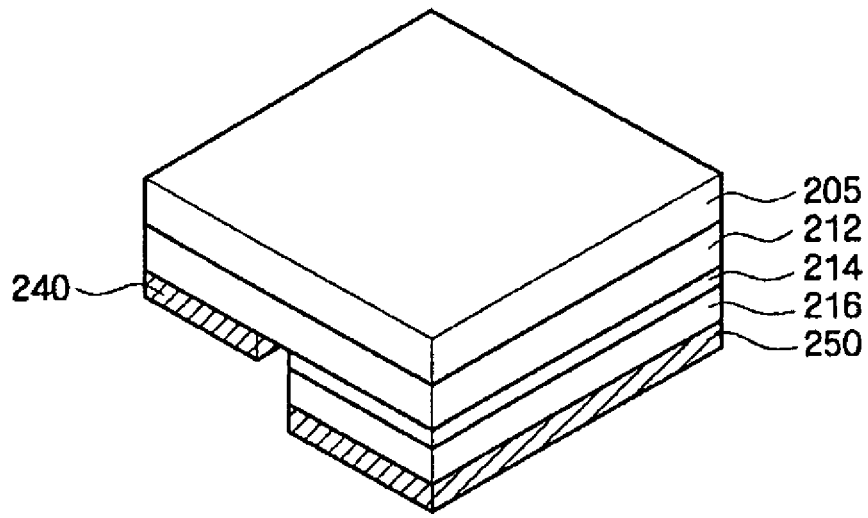

Then, referring to FIG. 18, by using the polycrystalline region 206, the second mother substrate 205, 206, and 207 is cut in the horizontal direction and the second light emitting element 200 is formed. In this exemplary embodiment, it is illustrated that the first light emitting element 100 is formed first and the second light emitting element 200 is formed next; however, the second light emitting element 200 can be formed before the first light emitting element 100 or both light emitting elements can be formed simultaneously.

Figure 19:
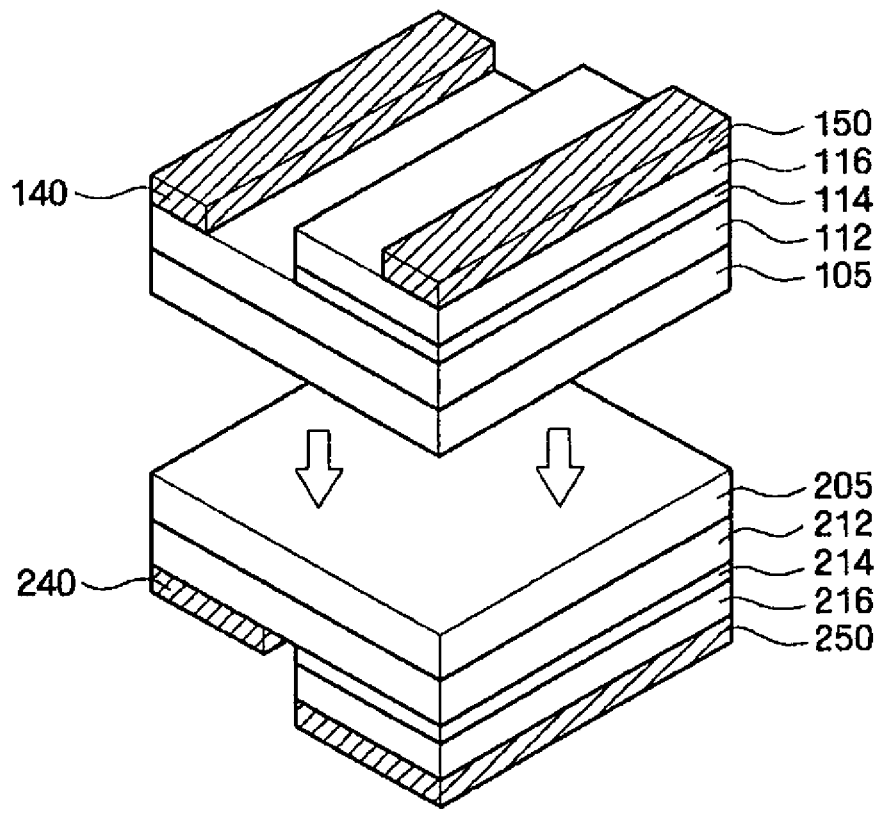

Next, referring to FIG. 19, the first light emitting element 100 and the second light emitting element 200 are joined together such that the first light emitting structure 112, 114, 116, 140, and 150 and the second light emitting structure 222, 224, 226, 240, and 250 are placed in an opposite direction relative to each other. As a result, the first substrate 105 and the second substrate 205 contact each other.

Figure 20:
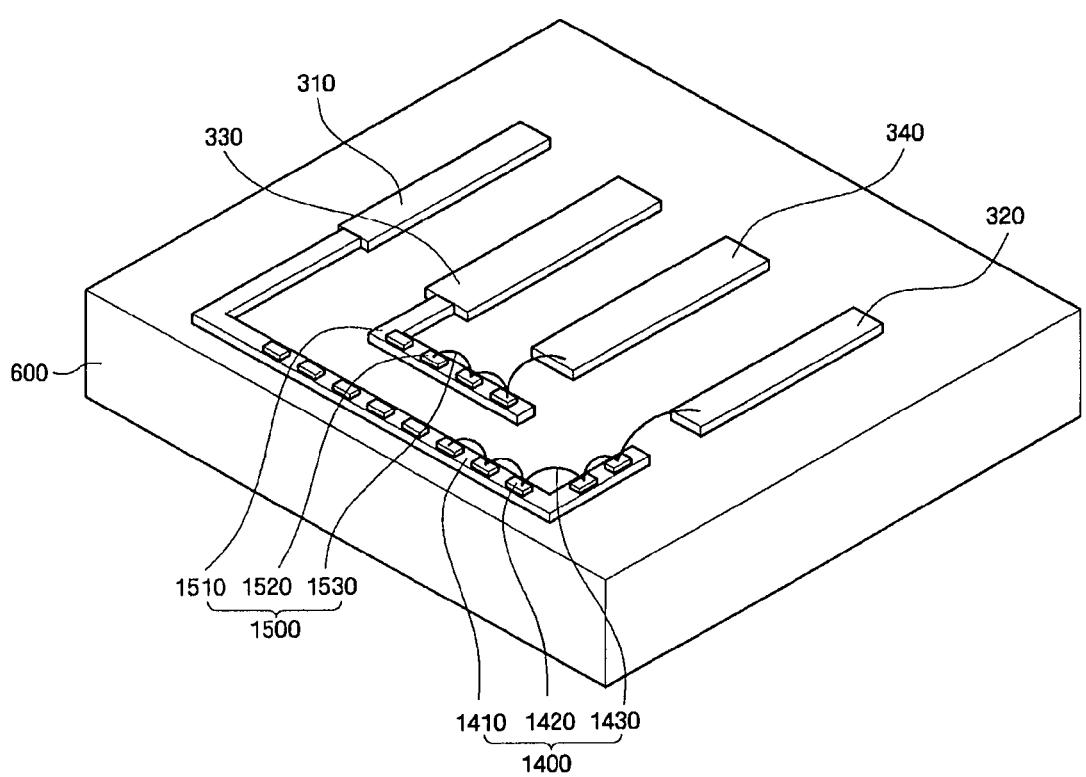

Then, referring to FIG. 20, first power supply patterns 310 and 320 and second power supply patterns 330 and 340 are formed on a support substrate 600. In this case, a first variable resistor 1400 which connects the first power supply patterns 310 and 320 and second variable resistor 1500, which connects the second power supply patterns 330 and 340 are formed with them.

Figure 21:
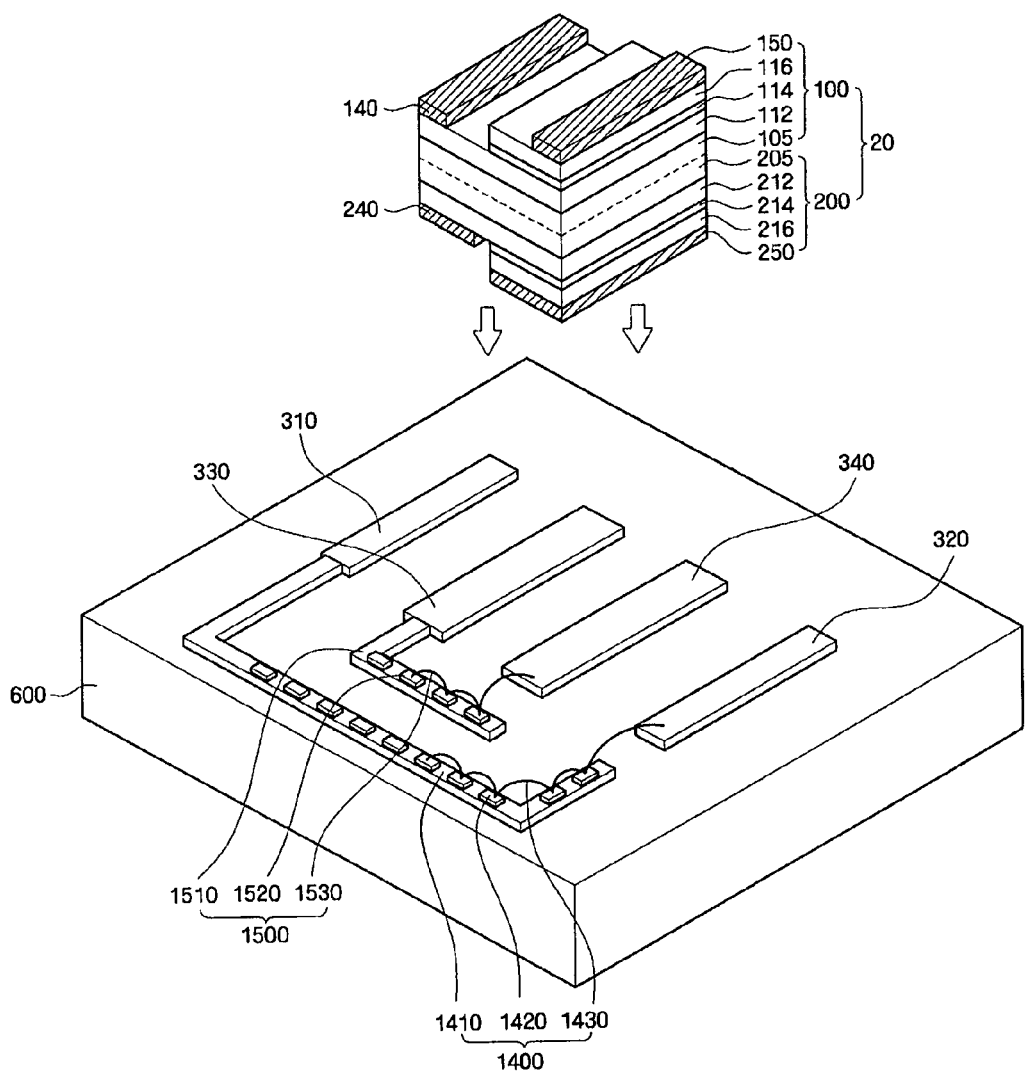

Next, referring to FIG. 21, a double-sided light emitting element 20 including the first light emitting element 100 and the second light emitting element 200 are connected to the first power supply patterns 310 and 320 and the second power supply patterns 330 and 340.

Finally, referring to FIGS. 1 and 2, the first power supply patterns 310 and 320 and the second power supply patterns 330 and 340 are connected to first lead electrodes 14a and 14b and second lead electrodes 14c and 14d, which are inserted into a housing 10. Next, inside the housing 10 a transparent resin layer 50 and a phosphorescence layer 60 are formed.

Although this exemplary embodiment is illustrated by using the method of fabricating light emitting device according to the first exemplary embodiment, it is obvious that the method of fabricating light emitting device according to other exemplary embodiments can be derived from this exemplary embodiment.

Also, it is obvious that the method of fabricating light emitting system according to the sixth through tenth exemplary embodiments can be derived from the method of fabricating light emitting device according to the eleventh exemplary embodiment.

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A light emitting device comprising:
a double-sided light emitting element including a first light emitting element on one side of a substrate that emits light having a first wavelength and a second light emitting element on another side of the substrate that emits light having a second wavelength, wherein the first wavelength and the second wavelength are different each other;
a first variable resistor coupled to the first light emitting element, the first variable resistor adjusting a first driving power applied to the first light emitting element; and
a second variable resistor coupled to the second light emitting element, the second variable resistor adjusting a second driving power applied to the second light emitting element; and
a support substrate and first and second power supply patterns positioned on the support substrate, the first and second power supply patterns applying power to the first and the second light emitting elements, respectively, wherein the first and the second variable resistors are connected to the first and second power supply patterns, respectively, and wherein at least one of the first and the second variable resistors includes a resistor pattern, multiple conductive patterns formed on the resistor pattern, and a resistance control wire that connects more than two conductive patterns selected from the multiple conductive patterns.

2. The light emitting device of claim 1, wherein the first light emitting element is wire bonded to the first power supply pattern and the second light emitting element is a flip chip bonded to the second power supply pattern.

3. The light emitting device of claim 1, wherein the first and the second variable resistors are connected to the first and second power supply pattern directly or through a wire.

4. The light emitting device of claim 1, wherein resistance values of the first and the second variable resistors are controlled by a number of the multiple conductive patterns that conduct current through the resistance control wire.

5. The light emitting device of claim 1 further comprising first and a second lead electrodes on which the support substrate and the first and the second light emitting elements are mounted and a housing into which the first and the second lead electrodes are inserted, the housing surrounding the first and the second light emitting elements.

6. The light emitting device of claim 5, wherein the first and the second variable resistors are connected to the first and the second lead electrodes, respectively.

7. The light emitting device of claim 6, wherein the first and the second variable resistors are connected to the first and the second lead electrodes, respectively, directly or through a wire.

8. The light emitting device of claim 1, further comprising a phosphorescence layer including a phosphor which transforms light having the first and second wavelengths generated from the first and second light emitting elements into light having a third wavelength, wherein the first through the third wavelengths generate white light.

9. The light emitting device of claim 8, wherein the first and the second variable resistors are controlled to adjust a color temperature of the white light.

10. The light emitting device of claim 8, wherein one of the first and second light emitting elements has a maximum light emitting efficiency and the other of the first and second light emitting elements does not have the maximum light emitting efficiency by controlling resistance values of the first and the second variable resistors to adjust a color temperature.

11. The light emitting device of claim 8, wherein the first light emitting element is a blue light emitting element which generates blue light, the second light emitting element is a red light emitting element which generates red light, and the phosphor is a green phosphor that transforms at least a part of the blue light or the red light to generate green light.

12. The light emitting device of claim 11, wherein the first and the second variable resistors are controlled to generate a reddish white light and or a bluish white light.

13. A light emitting device comprising:
a double-sided light emitting element including a first light emitting element on one side of a substrate that emits light having a first wavelength and a second light emitting element on another side of the substrate that emits light having a second wavelength, wherein the first wavelength and the second wavelength are different each other;
a first variable resistor coupled to the first light emitting element, the first variable resistor adjusting a first driving power applied to the first light emitting element; and
a second variable resistor coupled to the second light emitting element, the second variable resistor adjusting a second driving power applied to the second light emitting element; and
a support substrate and first and second power supply patterns positioned on the support substrate, the first and second power supply patterns applying power to the first and the second light emitting elements, respectively, wherein the first and the second variable resistors are connected to the first and second power supply patterns, respectively, and wherein the first and the second variable resistors include a resistor pattern and a resistance control groove that controls an area of the resistor pattern.

14. The light emitting device of claim 13, wherein resistance values of the first and second variable resistors are controlled by the area of the resistor pattern.

* * * * *